(12) United States Patent
Morita et al.

(10) Patent No.: US 7,320,828 B2
(45) Date of Patent: Jan. 22, 2008

(54) COMPOSITION FOR FORMING INSULATING FILM AND PROCESS FOR PRODUCING INSULATING FILM

(75) Inventors: Kensuke Morita, Shizuoka (JP); Yutaka Adegawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 357 days.

(21) Appl. No.: 11/060,544

(22) Filed: Feb. 18, 2005

(65) Prior Publication Data
US 2005/0182227 A1   Aug. 18, 2005

(30) Foreign Application Priority Data
Feb. 18, 2004   (JP)   ............... P.2004-041404

(51) Int. Cl.
*B32B 9/04* (2006.01)
(52) U.S. Cl. .................... 428/447; 427/384
(58) Field of Classification Search ............ 428/447; 427/387
See application file for complete search history.

(56) References Cited

U.S. PATENT DOCUMENTS

| 6,972,312 | B1* | 12/2005 | Lichtenhan et al. | ......... | 528/14 |
| 2003/0055193 | A1* | 3/2003 | Lichtenhan et al. | ......... | 528/10 |
| 2003/0096934 | A1* | 5/2003 | Jost et al. | ............. | 528/10 |

FOREIGN PATENT DOCUMENTS

JP   11-40554 A   2/1999

\* cited by examiner

*Primary Examiner*—Margaret G. Moore
(74) *Attorney, Agent, or Firm*—Sughrue Mion, Pllc.

(57) ABSTRACT

A composition for forming an insulating film comprising at least one of a compound represented by formula (I), a hydrolysate of the compound represented by formula (I) and a condensate of the compound represented by formula (I):

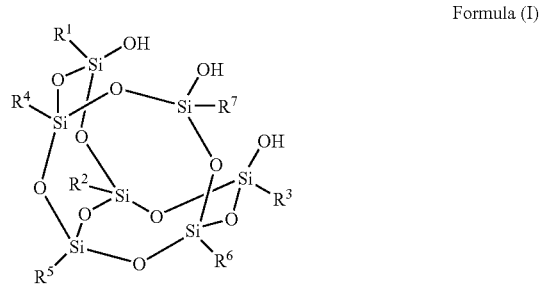

Formula (I)

wherein $R^1$ to $R^7$ each independently represents an organic group, and $R^1$ to $R^7$ are the same or different. And an insulating film obtained by a process, the process comprising using the compound represented by formula (I) as a starting material.

13 Claims, No Drawings

COMPOSITION FOR FORMING INSULATING FILM AND PROCESS FOR PRODUCING INSULATING FILM

BACKGROUND OF THE INVENTION

1. Field of the Invention

The present invention relates to a composition for forming an insulating film. More particularly, the invention relates to a composition for forming an insulating film which is capable of forming a coating film having an even thickness and suitable for use as an interlayer insulation film in semiconductor elements or the like, and an insulating film produced from the composition which is less apt to crack and excellent in dielectric constant characteristics, etc.

2. Description of the Related Art

Silica ($SiO_2$) films formed by vacuum processes including the vapor-phase epitaxy (CVD) process have been in frequent use as interlayer insulation film in semiconductor elements and the like. In recent years, an insulating film called an SOG (spin-on-Glass) film, which is formed from a coating fluid and comprises a tetraalkoxysilane hydrolysate as the main component, has come to be used for the purpose of forming a more even interlayer insulation film. Furthermore, an interlayer insulation film called an organic SOG film, which has a low dielectric constant and comprises a polyorganosiloxane as the main component, has been developed as a result of progress in the degree of integration in semiconductor elements and the like.

However, even the CVD-$SiO_2$ film, which is the lowest in dielectric constant among the inorganic material films, has a dielectric constant of about 4. Furthermore, although the SiOF film, which is being recently investigated as a low-dielectric constant CVD film, has a dielectric constant of about 3.3 to 3.5, this film has a problem that it is highly hygroscopic property and the dielectric constant thereof increases during use.

On the other hand, organic polymer films having a dielectric constant as low as 2.5 to 3.0 have a glass transition temperature as low as 200 to 350° C. and further have a high coefficient of thermal expansion. Because of this, the organic polymer films have a problem concerning damage to wirings. Moreover, the organic SOG film has a drawback that it suffers oxidation by the oxygen plasma ashing used for, e.g., resist removal in multilayer wiring pattern formation, and cracks.

In addition, the organic resins including the organic SOG film have the following problems. Since they have low adhesion to wiring materials, i.e., aluminum, aluminum-based alloys, copper, and copper-based alloys, application thereof results in voids beside the wiring (gaps formed between the wiring and the insulating material). There is a possibility that water might penetrate into the voids to cause wiring corrosion. Moreover, these voids generated beside wirings lead to short-circuiting between wirings when positional shifting occurs during the formation of via holes for forming a multilayered wiring, resulting in reduced reliability.

Under these circumstances, a coating composition for forming an insulating film comprising a copolymer containing an organopolysiloxane having a cage structure, specifically, a hydrogenated octasilsesquioxane, is known as an insulating-film material excellent in insulating properties, heat resistance, and durability (JP-A-11-40554).

However, with the trend toward a higher degree of integration and a higher degree of multilayer constitution in semiconductor elements and the like, better electrical insulation between conductors has come to be required. Namely, an interlayer insulation film material having a lower dielectric constant and excellent in crack resistance, heat resistance, and resistance to chemical mechanical polishing (CMP) has come to be desired.

SUMMARY OF THE INVENTION

Accordingly, an object of the invention is to provide a composition for forming an insulating film, which eliminates the problems described above and a silicone film formed from the composition. More particularly, the object is to provide a composition for forming an insulating film which is capable of forming a silicone film having an even thickness and suitable for use as an interlayer insulation film in semiconductor elements or the like, and an insulating film produced from the composition which is excellent in dielectric constant characteristics and especially in CMP resistance. Another object of the invention is to provide a process for producing an insulating film.

Those objects of the invention were found to be accomplished by the following means. Preferred embodiments are shown below.

(1) A composition for forming an insulating film comprising at least one of a compound represented by formula (I), a hydrolysate of the compound represented by formula (I), and a condensate of the compound represented by formula (I):

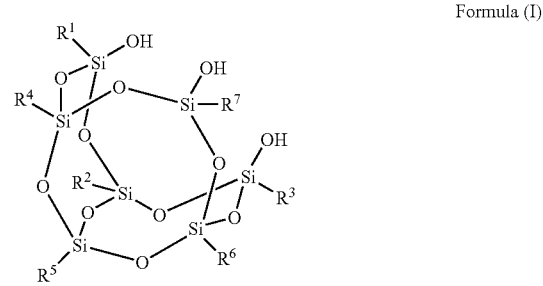

Formula (I)

wherein $R^1$ to $R^7$ each independently represents an organic group, and $R^1$ to $R^7$ are the same or different.

(2) The composition as described in (1) above, further comprising a basic catalyst.

(3) The composition as described in (1) or (2) above, wherein at least one of $R^1$ to $R^7$ represents a phenyl group.

(4) The composition as described in any of (1) to (3) above, further comprising at least one of a compound represented by formula (II), a hydrolysate of the compound represented by formula (II), and a condensate of the compound represented by formula (II):

$$R^8Si(OR^9)_3 \qquad \text{Formula (II)}$$

wherein $R^8$ represents a hydrogen atom, a fluorine atom or an organic group; and $R^9$ represents an organic group.

(5) The composition as described in (4) above, wherein $R^8$ represents a methyl group.

(6) The composition as described in (4) or (5) above, wherein an amount of the compound represented by formula (II) is from 0.1 to 50 mol per mol of the compound represented by formula (I).

(7) An insulating film obtained by a process, the process comprising using a compound represented by formula (I) as a starting material:

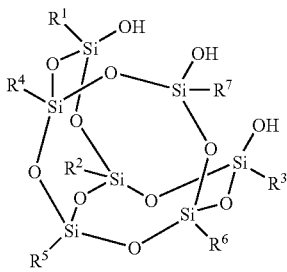

Formula (I)

wherein $R^1$ to $R^7$ each independently represents an organic group, and $R^1$ to $R^7$ are the same or different.

(8) The insulating film as described in (7) above, the using comprising:

applying a composition comprising the compound represented by formula (I) to a substrate to produce an applied composition; and heating the applied composition at a temperature of from 300° C. to 450° C., so as to form the insulating film.

(9) The insulating film as described in (8) above, wherein the composition further comprising a basic catalyst.

(10) The insulating film as described in any of (7) to (9) above, wherein at least one of $R^1$ to $R^7$ represents a phenyl group.

(11) The insulating film as described in any of (8) to (10) above, wherein the composition further comprising at least one of a compound represented by formula (II), a hydrolysate of the compound represented by formula (II), and a condensate of the compound represented by formula (II):

$$R^8Si(OR^9)_3 \quad \text{Formula (II)}$$

wherein $R^8$ represents a hydrogen atom, a fluorine atom or an organic group; and $R^9$ represents an organic group.

(12) The insulating film as described in (11) above, wherein $R^8$ represents a methyl group.

(13) The insulating film as described in (11) or (12) above, wherein an amount of the compound represented by formula (II) is from 0.1 to 50 mol per mol of the compound represented by formula (I).

(14) The insulating film as described in any of (7) to (13) above, which has a value of σ/average film thickness of 0.01 or less.

(15) A process for producing an insulating film comprising:

applying a composition for forming an insulating film as described in any of (1) to (6) above to a substrate to produce an applied composition; and heating the applied composition at a temperature of from 300° C. to 450° C., so as to form the insulating film.

DETAILED DESCRIPTION OF THE INVENTION

The present inventor has found that the composition for forming the insulating film of the invention gives an insulating film excellent in film thickness evenness and dielectric constant characteristics and especially in CMP resistance due to the incorporation of the ingredient represented by general formula (I) as stated above. The invention has been thus completed.

In the invention, the term "insulating film" means a film interposed between wirings in order to prevent a wiring delay attributable to the multilayer wiring constitution accompanying a higher degree of integration in ULSIs.

When the composition of the invention, which comprises an organosiloxane as a base compound or a polyorganosiloxane as a base polymer, is applied to a substrate such as a silicon wafer by, e.g., dipping or spin coating, then the gap between minute patterns can be sufficiently filled. By heating the applied composition to remove the organic solvent and conduct a cross-linking reaction, a film comprising a vitreous material or macromolecular material or of a mixture of these can be formed. The film obtained is excellent in low-dielectric constant characteristics and suitability for reflow and can be a thick insulator, which does not crack and has excellent CMP resistance.

Compounds to be used in the invention will be explained below in detail.

In the invention, the term "condensate of a silane compound" means a product of the condensation of silanol groups generated by the hydrolysis of a silane compound. However, in such a product of condensation, the silanol groups need not have been wholly condensed. Namely, that term means a conception which includes one in which the silanol groups have been partly condensed, a mixture of condensates differing in the degree of condensation, etc.

The compound represented by general formula (I) is explained next.

In the formula, $R^1$ to $R^7$ each independently represents an organic group. Examples of the organic group include alkyl groups (e.g., methyl, ethyl, propyl, butyl, pentyl, and hexyl), aryl groups (e.g., phenyl and naphthyl), and alkenyl groups (e.g., vinyl). These groups may be linear, branched, or cyclic. These groups may further have one or more substituents.

Preferred examples of the organic groups represented by $R^1$ and $R^2$ include methyl, isobutyl, cyclopentyl, cyclohexyl, phenyl, and vinyl. Especially preferred are methyl and phenyl. $R^1$ to $R^7$ may be the same or different.

Specific examples of the compound represented by general formula (I) are shown below, but the compound to be used in the invention should not be construed as being limited to these examples.

TABLE 1

Formula (I)

| | $R^1$ | $R^2$ | $R^3$ | $R^4$ | $R^5$ | $R^6$ | $R^7$ |
|---|---|---|---|---|---|---|---|
| I-1 | phenyl | phenyl | phenyl | phenyl | phenyl | phenyl | phenyl |
| I-2 | methyl | methyl | methyl | methyl | methyl | methyl | methyl |
| I-3 | vinyl | vinyl | vinyl | vinyl | vinyl | vinyl | vinyl |
| I-4 | phenyl | phenyl | phenyl | phenyl | phenyl | phenyl | phenyl |

The compound represented by general formula (I), or a hydrolysate or condensate thereof to be used may be a commercial one or may be one synthesized/isolated by, e.g., the method described in JP-T-2003-510337 (the term "JP-T" as used herein means a published Japanese translation of a PCT patent application). It is possible to use an alkoxysilane to yield the target compound in a reaction system. It is also possible to use a complete condensation type cage compound including eight silicon atoms after it is partly decomposed in a reaction system. From the standpoint of the effect of addition, it is preferred to use a high-purity compound isolated. In this case, the compound represented by general formula (I), or a hydrolysate or condensate thereof to be used as a raw material accounts for preferably at least 20% by weight, more preferably at least 30% by weight, most preferably at least 40% by weight, of the solid components of the composition.

The composition for forming the insulating film of the invention preferably comprises a compound represented by general formula (II), or a hydrolysate or condensate of the compound besides the compound represented by general formula (I), or the hydrolysate or condensate thereof.

In general formula (II), $R^8$ represents a hydrogen atom, a fluorine atom or an organic group, and $R^9$ represents an organic group. Examples of the organic groups represented by $R^8$ and $R^9$ in general formula (II) include alkyl groups, alkenyl groups, and aryl groups. The alkyl groups are lower alkyl groups having 1 to 5 carbon atoms, and examples thereof include methyl, ethyl, propyl, and butyl. Examples of the alkenyl groups include vinyl and allyl. Examples of the aryl groups include phenyl, naphthyl, and fluorophenyl.

These groups maybe linear, branched, or cyclic. These groups may further have one or more substituents.

$R^8$ and $R^9$ each preferably independently represents a lower alkyl group or phenyl group.

$R^8$ especially preferably represents a methyl group.

Specific examples of the compound represented by general formula (II) include trialkoxysilanes such as trimethoxysilane and triethoxysilane; triaryloxysilanes such as triphenoxysilane; fluorine-substituted trialkoxysilanes such as fluorotrimethoxysilane and fluorotriethoxysilane; alkyltrimethoxysilanes such as methyltrimethoxysilane and ethyltrimethoxysilane; alkyltriethoxysilanes such as methyltriethoxysilane and ethyltriethoxysilane; alkyltri-n-propoxysilanes such as methyltri-n-propoxysilane and ethyltri-n-propoxysilane; alkyltriisopropoxysilanes such as methyltriisopropoxysilane and ethyltriisopropoxysilane; alkyltri-n-butoxysilanes such as methyltri-n-butoxysilane and ethyltri-n-butoxysilane; alkyltri-sec-butoxysilanes such as methyltri-sec-butoxysilane and ethyltri-sec-butoxysilane; alkyltri-tert-butoxysilanes such as methyltri-tert-butoxysialne and ethyltri-tert-butoxysilane; alkyltriphenoxysilanes such as methyltriphenoxysilane and ethyltriphenoxysilane; and phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, phenyltriethoxysilane, γ-aminopropyltrimethoxysilane,γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane.

Preferred examples of the compound represented by general formula (II) include methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, and phenyltriethoxysilane. Most preferred are methyltrimethoxysilane and methyltriethoxysilane.

One of such compounds represented by general formula (II) may be used alone, or two or more thereof may be simultaneously used.

The amount of the compound represented by general formula (II) to be added is preferably 0.1 to 50 mol, more preferably 1 to 20 mol, most preferably 2 to 12 mol, per mol of the compound represented by general formula (I).

When a silane compound represented by general formula (II) is hydrolyzed and condensed, it is preferred to use 0.5 to 150 mol of water per mol of the alkoxysilane. It is especially preferred to add 1 to 100 mol of water. When the amount of the water added is 0.5 mol or more, there are cases where the composition gives a film having an excellent crack resistance. When the amount of the water is 150 mol or less, there are no cases where polymer precipitation or gelation occurs during the hydrolysis and condensation reactions.

The composition for forming the insulating film of the invention may comprise a hydrolysate or condensate of a tetraalkoxysilane (e.g., tetramethoxysilane or tetraethoxysilane).

In producing the silane compound to be used in the invention, it is preferred to use a basic catalyst, acid catalyst, or metal chelate compound for the hydrolysis/condensation of a silane compound.

Examples of the basic catalyst include sodium hydroxide, potassium hydroxide, lithium hydroxide, pyridine, pyrrole, piperazine, pyrrolidine, piperidine, picoline, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, heptylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, 1-amino-3-methylbutane, dimethylglycine, and 3-amino-3-methylamine. Preferred of these are the amines and amine salts. Especially preferred are the organic amines and organic amine salts. Most preferred are the alkylamines and tetraalkylammonium hydroxides. One of these basic catalysts may be used alone, or two or more thereof may be simultaneously used.

Examples of the metal chelate compound include titanium chelate compounds such as triethoxymono(acetylacetonato)titanium, tri-n-propoxymono(acetylacetonato)titanium, tri-isopropoxymono(acetylacetonato)titanium, tri-n-butoxymono(acetylacetonato)titanium, tri-sec-butoxymono(acetylacetonato)titanium, tri-t-butoxymono(acetylacetonato)titanium, diethoxybis(acetylacetonato)titanium, di-n-propoxybis(acetylacetonato)titanium, diisopropoxybis(acetylacetonato)titanium, di-n-butoxybis(acetylacetonato)titanium, di-sec-butoxybis(acetylacetonato)titanium, di-t-butoxybis(acetylacetonato)titanium, monoethoxytris(acetylacetonato)titanium, mono-n-propoxytris(acetylacetonato)titanium, monoisopropoxytris(acetylacetonato)titanium, mono-n-butoxytris(acetylacetonato)titanium, mono-sec-butoxytris(acetylacetonato)titanium, mono-t-butoxytris(acetylacetonato)titanium, tetrakis(acetylacetonato)titanium, triethoxymono(ethylacetoacetato)titanium, tri-n-propoxymono(ethylacetoacetato)titanium, triisopropoxymono(ethylacetoacetato)titanium, tri-n-butoxymono(ethylacetoacetato)titanium, tri-sec-butoxymono(ethylacetoacetato)titanium, tri-t-butoxymono(ethylacetoacetato)titanium, diethoxybis(ethylacetoacetato)titanium, di-n-propoxybis(ethylacetoacetato)titanium, diisopropoxybis(ethylacetoacetato)titanium, di-n-butoxybis (ethylacetoacetato)titanium, di-sec-butoxybis(ethylacetoacetato)titanium, di-t-butoxybis(ethylacetoacetato)titanium, monoethoxytris(ethylacetoacetato)titanium, mono-n-propoxytris(ethylacetoacetato)titanium, monoisopropoxytris (ethylacetoacetato)titanium, mono-n-butoxytris(ethylacetoacetato)titanium, mono-sec-butoxytris (ethylacetoacetato)titanium, mono-t-butoxytris (ethylacetoacetato)titanium, tetrakis(ethylacetoacetato) titanium, mono(acetylacetonato)tris(ethylacetoacetato) titanium, bis(acetylacetonato)bis(ethylacetoacetato) titanium, and tris(acetylacetonato)mono(ethylacetoacetato) titanium; zirconium chelate compounds such as triethoxymono(acetylacetonato)zirconium, tri-n-propoxy-mono(acetylacetonato)zirconium, triisopropoxymono (acetylacetonato)zirconium, tri-n-butoxymono(acetylacetonato)zirconium, tri-sec-butoxymono(acetylacetonato) zirconium, tri-t-butoxymono(acetylacetonato)zirconium, diethoxybis(acetylacetonato)zirconium, di-n-propoxybis (acetylacetonato)zirconium, diisopropoxybis(acetylacetonato)zirconium, di-n-butoxybis(acetylacetonato)zirconium, di-sec-butoxybis(acetylacetonato)zirconium, di-t-butoxybis (acetylacetonato)zirconium, monoethoxytris(acetylacetonato)zirconium, mono-n-propoxytris(acetylacetonato)zirconium, monoisopropoxytris(acetylacetonato)zirconium, mono-n-butoxytris(acetylacetonato)zirconium, mono-sec-butoxytris(acetylacetonato)zirconium, mono-t-butoxytris (acetylacetonato)zirconium, tetrakis(acetylacetonato)zirconium, triethoxymono(ethylacetoacetato)zirconium, tri-n-propoxymono(ethylacetoacetato)zirconium, triisopropoxymono(ethylacetoacetato)zirconium, tri-n-butoxymono(ethylacetoacetato)zirconium, tri-sec-butoxy-mono(ethylacetoacetato)zirconium, tri-t-butoxymono(ethylacetoacetato)zirconium, diethoxybis(ethylacetoacetato) zirconium, di-n-propoxybis(ethylacetoacetato)zirconium, diisopropoxybis(ethylacetoacetato)zirconium, di-n-butoxybis(ethylacetoacetato)zirconium, di-sec-butoxybis(ethylacetoacetato)zirconium, di-t-butoxybis(ethylacetoacetato)zirconium, monoethoxytris(ethylacetoacetato)zirconium, mono-n-propoxytris(ethylacetoacetato)zirconium, monoisopropoxytris(ethylacetoacetato)zirconium, mono-n-butoxy-tris(ethylacetoacetato)zirconium, mono-sec-butoxytris (ethylacetoacetato)zirconium, mono-t-butoxytris (ethylacetoacetato)zirconium, tetrakis(ethylacetoacetato) zirconium, mono(acetylacetonato)tris(ethylacetoacetato) zirconium, bis(acetylacetonato)bis(ethylacetoacetato) zirconium, and tris(acetylacetonato)mono (ethylacetoacetato)zirconium; and aluminum chelate compounds such as tris(acetylacetonato)aluminum and tris (ethylacetoacetato)aluminum. Preferred of these are the titanium or aluminum chelate compounds. Especially preferred are the titanium chelate compounds. One of these metal chelate compounds may be used alone, or two or more thereof may be simultaneously used.

Examples of the acid catalyst include inorganic acids such as hydrochloric acid, nitric acid, sulfuric acid, hydrofluoric acid, phosphoric acid, and boric acid; and organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, tartaric acid, succinic acid, itaconic acid, mesaconic acid, citraconic acid, malic acid, a hydrolysate of glutaric acid, a hydrolysate of maleic anhydride, and a hydrolysate of phthalic anhydride. More preferred examples thereof include the organic carboxylic acids. One of these acid catalysts may be used alone, or two or more thereof may be simultaneously used.

Preferred of those catalysts are the basic catalysts. More preferred are the tetraalkylammonium hydroxides. Most preferred is tetramethylammonium hydroxide.

The amount of the catalyst to be used is generally 0.00001 to 10 mol, preferably 0.00005 to 5 mol, per mol of a compound (I) (A compound (I) is a compound represented by general formula (I)). As long as the amount of the catalyst used is within that range, the possibility of polymer precipitation or gelation during the reaction is low. In the invention, the temperature for the condensation of the compound (I) is generally 0 to 100° C., preferably 10 to 90° C.

The composition for forming the insulating film of the invention preferably comprises a hydrolysate or condensate of a compound represented by general formula (II) besides the compound represented by general formula (I), or the hydrolysate or condensate thereof. For producing this composition for forming an insulating film, use may be made, for example, of a method comprising mixing the compound represented by general formula (I) with the compound represented by general formula (II) and then hydrolyzing and condensing the mixture, or a method comprising condensing the compound represented by general formula (I) and then adding the compound represented by general formula (II) thereto, or a method comprising hydrolyzing and condensing the compound represented by general formula (II) and then adding the compound represented by general formula (I) thereto.

The composition for forming the insulating film of the invention is dissolved in any of the following solvents before being applied to a substrate. Preferred examples of usable solvents include ethylene dichloride, cyclohexanone, cyclopentanone, 2-heptanone, methyl isobutyl ketone, γ-butyrolactone, methyl ethyl ketone, methanol, ethanol, dimethylimidazolidinone, ethylene glycol monomethy ether, ethylene glycol monoethyl ether, ethylene glycol dimethyl ether, 2-methoxyethyl acetate, ethylene glycol monoethyl ether acetate, propylene glycol monomethyl ether (PGME), propylene glycol monomethyl ether acetate (PGMEA), tetraethylene glycol dimethyl ether, triethylene glycol monobutyl ether, triethylene glycol monomethyl ether, isopropanol, ethylene carbonate, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethylacetamide, dimethyl sulfoxide, N-methylpyrrolidone, tetrahydrofuran, diisopropylbenzene, toluene, xylene, and mesitylene. These solvents are used alone or as a mixture of two or more thereof.

Preferred solvents among those include propylene glycol monomethyl ether acetate, propylene glycol monomethyl ether, 2-heptanone, cyclohexanone, γ-butyrolactone, ethylene glycol monomethyl ether, ethylene glycol monoethyl ether, ethylene glycol monoethyl ether acetate, propylene glycol monomethyl ether, propylene glycol monoethyl ether, ethylene carbonate, butyl acetate, methyl lactate, ethyl lactate, methyl methoxypropionate, ethyl ethoxypropionate, N-methylpyrrolidone, N,N-dimethylformamide, tetrahydrofuran, methyl isobutyl ketone, xylene, mesitylene, and diisopropylbenzene.

The total solid concentration of the composition of the invention thus obtained is preferably 2 to 30% by weight. It is suitably regulated according to the intended use. When the total solid concentration of the composition is 2 to 30% by weight, the composition gives a coating film having a thickness in an appropriate range and has better storage stability.

The composition for forming the insulating film of the invention thus obtained is applied to a substrate such as, e.g., a silicon wafer, $SiO_2$ wafer, or SiN wafer. For this application, a coating technique such as, e.g., spin coating, dipping, roll coating, or spraying is used.

In this application, a coating film having a thickness on a dry basis of about 0.05 to 1.5 μm or about 0.1 to 3 μm can be formed in the case of single coating or double coating, respectively. Thereafter, the coating film is dried at ordinary temperature or dried with heating at a temperature of about 80 to 600° C. for generally about 5 to 240 minutes. Thus, an insulating film made of a vitreous material or macromolecular material or of a mixture of these can be formed. For this heating, a hot plate, oven, furnace, or the like can be used. This heating can be conducted in the air, in a nitrogen or argon atmosphere, under vacuum, or in a reduced-pressure atmosphere having a controlled oxygen concentration.

More specifically, the composition for forming the insulating film of the invention is applied to a substrate (usually, a substrate having a metallic wiring) by, e.g., spin coating and subjected to a first heat treatment at a temperature of 300° C. or lower to thereby remove the solvent and simultaneously cross-link the siloxane contained in the composition for forming the insulating film. Subsequently, a second heat treatment (annealing) is conducted at a temperature higher than 300° C. and not higher than 450° C. Thus, an insulating film having a low dielectric constant can be formed. The reason why the first heat treatment is conducted at a temperature of 300° C. or lower is that such temperature facilitates regulation of the degree of cross-linking while preventing the cross-linking from proceeding excessively. The reason why the second heat treatment is conducted at a temperature higher than 300° C. and not higher than 450° C. is that this temperature range is generally advantageous to the annealing.

The cross-linking of the siloxane in the first heat treatment proceeds with the formation of Si—O—Si bonds by oxidation. This first heat treatment can hence be advantageously conducted in the air. The degree of cross-linking may be regulated in order to regulate the dielectric constant of the insulating film formed. This regulation of the degree of cross-linking can be accomplished by regulating the heat treatment temperature and time.

In the invention, voids may be formed during the formation of the insulating film to thereby further reduce the dielectric constant.

The interlayer insulation film thus obtained has excellent insulating properties and is excellent also in coating film evenness, dielectric constant characteristics, crack resistance, and surface hardness. The composition of the invention is hence useful in applications such as interlayer insulation films for semiconductor elements such as LSIs, system LSIs, DRAMs, SDRAMs, RDRAMs, and D-RDRAMs, protective films such as surface coat films for semiconductor elements, interlayer insulation films for multilayered wiring boards, protective films or antireflection films for liquid-crystal display elements, etc.

EXAMPLES

The invention will be explained below in more detail by reference to Example. In the following Example and Comparative Examples, all parts and percents are by weight unless otherwise indicated. The coating films obtained in the Example and Comparative Examples were evaluated by the following methods.

Dielectric Constant

Relative dielectric constant was measured with a mercury probe manufactured by Four Dimensions, Inc.

Evenness of Film Thickness

The thickness of the film obtained was measured with an optical film thickness gauge with respect to 50 points. The average film thickness and the value of σ were determined, and the value of σ/(average film thickness) was taken as an index to film thickness evenness. The smaller the value, the more the film thickness is even and satisfactory.

CMP Resistance

The film obtained was polished under the following conditions.

Slurry: silica-hydrogen peroxide system
Polishing pressure: 300 $g/cm^2$
Polishing time: 60 sec The film was evaluated according to the following criteria:

A: No change
B: The film had partial peeling or marks.

Synthesis Example 1

Into a 50-mL three-necked flask were introduced 10 g of exemplified compound (I-1), 8.56 mL of methyltriethoxysilane, 9 mL of cyclohexanone, 11.2 mL of ethanol, 5.6 mL of ion-exchanged water, and 400 μL of a 26% aqueous solution of tetramethylammonium hydroxide. The contents were stirred at 70° C. for 2 hours and then concentrated at a reduced pressure until the weight of the residue reached 85 g. Thereafter, cyclohexanone was added thereto to adjust the total amount to 93.3 g. Thus, reaction mixture 1 was obtained. Analysis by GPC (using polystyrene standard) revealed that the reaction mixture was a polymer solution having a weight-average molecular weight of 2,500.

Example 1

Reaction mixture 1 was filtered through a filter made of Teflon (trademark) having a pore diameter of 0.2 μm to thereby obtain a composition for forming an insulating film of the invention. The composition obtained was applied to a 4-inch silicon wafer by spin coating. Thereafter, the substrate was dried on a hot plate at 110° C. for 90 seconds and subsequently at 250° C. for 60 seconds and then cured in a nitrogen atmosphere in a 400° C. oven. Thus, a coating film was obtained.

Comparative Example 1

Into a 50-mL three-necked flask were introduced 14.9 g of phenyltrimethoxysilane, 8.56 mL of methyltriethoxysilane, 90 mL of cyclohexanone, 33.6 mL of ethanol, 16.8 mL of ion-exchanged water, and 1.2 mL of a 26% aqueous solution of tetramethylammonium hydroxide. The contents were stirred at 70° C. for 2 hours and then concentrated at a reduced pressure until the weight of the residue reached 85 g. Thereafter, cyclohexanone was added thereto to adjust the total amount to 93.3 g. Thus, reaction mixture 2 was obtained. Analysis by GPC (using polystyrene standard) revealed that the reaction mixture was a polymer solution having a weight-average molecular weight of 1,900. This solution was used to obtain a coating film by the same procedure as in Example 1.

Comparative Example 2

An insulating film was produced in the same manner as in the Example 1 given in JP-A-11-40554, which is corresponds to an insulating film produced from a composition comprising a siloxane having an $Si_8$ cage structure, and a ladder siloxane. This insulating film was examined and, as a result, was found to have a poor surface state. This is because the composition contained a large amount of an $Si_8$ cage structure containing no residual silanol groups available for cross-linking during film formation.

The evaluation results obtained in Example 1 and Comparative Examples 1 and 2 are shown in Table 2.

TABLE 2

|  | σ/average film thickness | Relative dielectric constant | CMP resistance |
| --- | --- | --- | --- |
| Example 1 | 0.006 | 2.70 | A |
| Comparative Example 1 | 0.04 | 2.84 | B |
| Comparative Example 2 | 0.09 | 2.80 | B |

As apparent from a comparison between the Example and each of the Comparative Examples in the evaluation results, the invention can form a silicone film which has an even thickness and is suitable for use as an interlayer insulation film in semiconductor elements or the like and which further has excellent dielectric constant characteristics and, in particular, excellent CMP resistance.

According to a composition for forming an insulating film and process for producing an insulating film of the invention, an insulating film, which is excellent in dielectric constant characteristics and especially in CMP resistance, produced from a composition for forming an insulating film, which is capable of forming a silicone film having an even thickness and being suitable for use as an interlayer insulation film in semiconductor elements or the like, can be obtained.

The entire disclosure of each and every foreign patent application from which the benefit of foreign priority has been claimed in the present application is incorporated herein by reference, as if fully set forth.

What is claimed is:

1. An insulating film obtained by a process, the process comprising
    using a compound represented by formula (I) as a starting material:

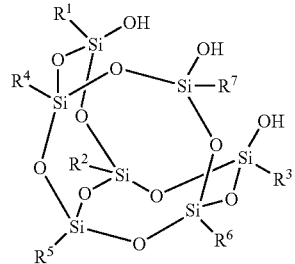

Formula (I)

wherein $R^1$ to $R^7$ each independently represents an organic group, and $R^1$ to $R^7$ are the same or different, wherein the using comprises:
applying a composition comprising the compound represented by formula (I) to a substrate to produce an applied composition; and
heating the applied composition at a temperature of from 300° C. to 450° C., so as to form the insulating film.

2. The insulating film according to claim 1, wherein the composition further comprises a basic catalyst.

3. The insulating film according to claim 1, wherein at least one of $R^1$ to $R^7$ represents a phenyl group.

4. The insulating film according to claim 1, wherein the composition further comprises at least one of a compound represented by formula (II), a hydrolysate of the compound represented by formula (II), and a condensate of the compound represented by formula (II):

$$R^8Si(OR^9)_3 \qquad \text{Formula (II)}$$

wherein $R^8$ represents a hydrogen atom, a fluorine atom or an organic group; and
$R^9$ represents an organic group.

5. The insulating film according to claim 4, wherein $R^8$ represents a methyl group.

6. The insulating film according to claim 4, wherein an amount of the compound represented by formula (II) is from 0.1 to 50 mol per mol of the compound represented by formula (I).

7. The insulating film according to claim 1, which has a value of σ/average film thickness of 0.01 or less.

8. A process for producing an insulating film comprising:
providing a composition for forming an insulating film comprising at least one of a compound represented by formula (I) and a condensate of the compound represented by formula (I):

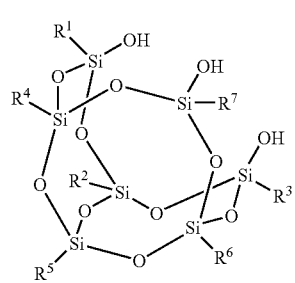

Formula (I)

wherein $R^1$ to $R^7$ each independently represents an organic group, and $R^1$ to $R^7$ are the same or different;

applying the composition for forming an insulating film to a substrate to produce an applied composition; and heating the applied composition at a temperature of from 300° C. to 450° C., so as to form the insulating film.

9. The process for producing an insulating film according to claim 8, wherein the composition for forming an insulating film further comprises a basic catalyst.

10. The process for producing an insulating film according to claim 8, wherein at least one of $R^1$ to $R^7$ represents a phenyl group.

11. The process for producing an insulating film according to claim 8, further comprising providing at least one of a compound represented by formula (II), a hydrolysate of the compound represented by formula (II), and a condensate of the compound represented by formula (II):

$$R^8Si(OR^9)_3 \qquad \text{Formula (II)}$$

wherein $R^8$ represents a hydrogen atom, a fluorine atom or an organic group; and $R^9$ represents an organic group.

12. The process for producing an insulating film according to claim 11, wherein $R^8$ represents a methyl group.

13. The process for producing an insulating film according to claim 11, wherein an amount provided of the compound represented by formula (II) is from 0.1 to 50 mol per mol of the compound represented by formula (I).

* * * * *